US010459497B2

(12) United States Patent
Lu et al.

(10) Patent No.: US 10,459,497 B2
(45) Date of Patent: Oct. 29, 2019

(54) ELECTRONIC COMPUTING DEVICE AND AIR-GUIDING COVER THEREOF

(71) Applicant: Wistron Corp., New Taipei (TW)

(72) Inventors: You Hsiung Lu, New Taipei (TW); Shuen-Chuan Chiang, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 16/017,994

(22) Filed: Jun. 25, 2018

(65) Prior Publication Data

US 2019/0250680 A1 Aug. 15, 2019

(30) Foreign Application Priority Data

Feb. 9, 2018 (TW) .............................. 107104723 A

(51) Int. Cl.
*H05K 7/20* (2006.01)
*G06F 1/18* (2006.01)
*G06F 1/20* (2006.01)

(52) U.S. Cl.
CPC ................ *G06F 1/20* (2013.01); *G06F 1/181* (2013.01); *H05K 7/20127* (2013.01); *G06F 2200/201* (2013.01)

(58) Field of Classification Search
CPC ... H01L 23/467; G06F 1/20; G06F 2200/201; G06F 1/181; H05K 7/20745; H05K 7/20736; H05K 7/20145; H05K 7/20727; H05K 7/20754; H05K 7/20
See application file for complete search history.

(56) References Cited

U.S. PATENT DOCUMENTS

| 5,559,673 A * | 9/1996 | Gagnon | G06F 1/20 165/122 |
| 5,788,570 A * | 8/1998 | Cho | F24F 1/0011 454/233 |
| 5,873,407 A * | 2/1999 | Wang | G06F 1/20 165/122 |
| 6,690,757 B1 * | 2/2004 | Bunton | H04L 25/14 370/427 |
| 9,235,242 B2 * | 1/2016 | Yang | G06F 1/20 |
| 2004/0022024 A1 * | 2/2004 | Le | H05K 7/20727 361/695 |
| 2005/0135048 A1 * | 6/2005 | Chiang | G06F 1/20 361/679.47 |

(Continued)

FOREIGN PATENT DOCUMENTS

| CN | 103809711 A | 5/2014 |
| JP | 2001-257494 A | 9/2001 |

(Continued)

*Primary Examiner* — Adam B Dravininkas

(57) ABSTRACT

An air-guiding cover is provided. The air-guiding cover includes a cover body, a first cover member, and a second cover member. The cover body is selectively connected to the first cover member and the second cover member. When the cover body is connected to the first cover member, the air-guiding cover is in the first guiding state, and the air-guiding cover separates air flow into a first flow and a second flow. When the cover body is connected to the second cover member, the air-guiding cover is in the second guiding state, and the air-guiding cover gathers the air flow into a third flow.

21 Claims, 11 Drawing Sheets

(56) References Cited

U.S. PATENT DOCUMENTS

| | | | | |
|---|---|---|---|---|
| 2006/0011330 A1* | 1/2006 | Wang | .................... | H01L 23/467 165/122 |
| 2007/0223200 A1* | 9/2007 | Fujiya | ................ | H05K 7/20727 361/727 |
| 2008/0113607 A1* | 5/2008 | Shih | .......................... | G06F 1/20 454/233 |
| 2009/0323282 A1* | 12/2009 | Holdredge | ......... | H05K 7/20145 361/694 |
| 2010/0182748 A1* | 7/2010 | Huang | .................. | G06F 1/1656 361/690 |
| 2011/0134605 A1* | 6/2011 | Chou | ..................... | G06F 1/203 361/679.48 |
| 2011/0157816 A1* | 6/2011 | Ma | ........................... | G06F 1/20 361/679.48 |
| 2012/0298334 A1* | 11/2012 | Madaffari | .......... | H05K 7/20745 165/104.13 |
| 2013/0141865 A1* | 6/2013 | Wu | .......................... | G06F 1/20 361/679.33 |
| 2013/0229774 A1* | 9/2013 | Chen | .................. | H05K 7/20136 361/695 |
| 2013/0250517 A1* | 9/2013 | Yang | ......................... | G06F 1/20 361/697 |
| 2014/0036433 A1* | 2/2014 | Guan | ........................ | G06F 1/20 361/679.32 |
| 2018/0054923 A1* | 2/2018 | Bryan | ....................... | G06F 1/20 |
| 2018/0343768 A1* | 11/2018 | Yang | .................. | H05K 7/20145 |

FOREIGN PATENT DOCUMENTS

| | | |
|---|---|---|
| TW | M261747 | 4/2005 |
| TW | M305924 U | 2/2007 |
| TW | M338388 U | 8/2008 |
| TW | I315659 B | 10/2009 |
| TW | 201226714 A1 | 7/2012 |
| TW | 201239307 A1 | 10/2012 |
| TW | I487474 B | 6/2015 |

\* cited by examiner

ELECTRONIC COMPUTING DEVICE AND AIR-GUIDING COVER THEREOF

CROSS REFERENCE TO RELATED APPLICATIONS

This Application claims priority of Taiwan Patent Application No. 107104723, filed on Feb. 9, 2018, the entirety of which is incorporated by reference herein.

BACKGROUND OF THE INVENTION

Field of the Invention

The present invention relates to an electronic computing device, and in particular to an electronic computing device with an air-guiding cover.

Description of the Related Art

In conventional electronic computing devices, an air-guiding cover is disposed to change the path of air flow. The air flow is guided by the air-guiding cover, and passes the main heat source (the central processing unit; CPU) to remove heat from the main heat source. However, the functioning of electronic computing devices has gradually become more complicated. There may be more than one main heat source in one single electronic computing device. For example, the central processing unit and the graphics card both produce heat. The design of the air-guiding cover depends on the elements disposed inside of the electronic computing device. The design of the electronic computing device may change many times during the manufacturing process. For example, due to cost considerations, an electronic computing device with a graphics card may be changed to become an electronic computing device with a plug-and-play expansion card, and the air-guiding cover must be redesigned. The redesigned air-guiding cover must be formed by redesigned the mold. This increases the cost of the air-guiding cover, and slows down the manufacturing speed of the electronic computing device.

BRIEF SUMMARY OF THE INVENTION

In one embodiment, an electronic computing device is provided. The electronic computing device includes a housing, a mainboard, a central processing unit, an expansion unit, and an air-guiding cover. The housing includes a device inlet side and a device outlet side. The mainboard is disposed in the housing. The central processing unit is disposed on the mainboard. The expansion unit is coupled to the mainboard. The air-guiding cover covers above the central processing unit, wherein the air-guiding cover is located between the expansion unit and the device inlet side. The air-guiding cover is adapted to be switched between a first guiding state and a second guiding state. When the air-guiding cover is in the first guiding state, the air-guiding cover separates the air flow from the device inlet side into a first flow and a second flow. The first flow passes the central processing unit to remove heat from the central processing unit (referred to as central processing unit heat), and then passes through a first gap between the expansion unit and the mainboard and travels to the device outlet side. The second air flow is guided by the air-guiding cover, and then directly passes the expansion unit to remove heat from the expansion unit (referred to as expansion unit heat). When the air-guiding cover is in the second guiding state, the air-guiding cover gathers the air flow from the device inlet side into a third flow, the third flow passes the central processing unit to remove the central processing unit heat and then passes the expansion unit to proceed to the device outlet side.

In one embodiment, the air-guiding cover comprises a cover body. The air-guiding cover selectively comprises a first cover member and a second cover member. When the cover body is connected to the first cover member, the air-guiding cover is in the first guiding state, and when the cover body is connected to the second cover member, the air-guiding cover is in the second guiding state.

In one embodiment, the cover body comprises a first path structure and a second path structure. The first cover member comprises a first shielding wall and a guiding frame. The guiding frame defines a first cover opening. The first shielding wall connects to the guiding frame. An entrance notch is formed between the first shielding wall and the guiding frame. The first shielding wall corresponds to the first path structure. The entrance notch corresponds to the second path structure, and the central processing unit is in the first path structure.

In one embodiment, when the cover body connects to the first cover member, the first flow passes through the first path structure and is guided by the first shielding wall, and passes through a second gap between the guiding frame and the mainboard to leave the guiding cover. The second flow passes through the second path structure, enters the entrance notch, and passes through the first cover opening.

In one embodiment, the guiding frame comprises a surrounding wall, and the surrounding wall surrounds the first cover opening.

In one embodiment, when the guide cover is in the first guiding state, the expansion unit comprises a graphics card, a unit inlet, and a unit outlet. The first cover opening corresponds to the unit inlet. The second air flow travels from the first cover opening, enters the unit inlet, removes heat from the graphics card (referred to as graphics card heat), and leaves the expansion unit through the unit outlet.

In one embodiment, the cover body further comprises a third path structure, wherein the first path structure is sandwiched between the second path structure and the third path structure. When the cover body connects to the first cover member, the second flow passes through the second path structure and the third path structure simultaneously, and enters the entrance notch, and passes through the first cover opening.

In one embodiment, the second cover member comprises a second shielding wall and a second cover opening. The second shielding wall blocks the second path structure, and the second cover opening is communicated to the first path structure.

In one embodiment, when the cover body connects to the second cover member, the third flow passes through the first path structure and the second cover opening, and passes the expansion unit.

In one embodiment, when the guide cover is in the second guiding state, the expansion unit comprises at least one plug-and-play expansion card.

In one embodiment, the cover body further comprises a third path structure. The first path structure is sandwiched between the second path structure and the third path structure. When the cover body connects to the second cover member, the second shielding wall blocks the second path structure and the third path structure.

In one embodiment, on a projection plane, when the guide cover is in the first guiding state, the first flow passes the guide cover in a straight path, and the second flow passes the guide cover in a Y-shaped path. When the guide cover is in the second guiding state, the third flow passes the guide cover in the straight path.

In one embodiment, an air-guiding cover is provided. The air-guiding cover includes a cover body, a first cover member, and a second cover member. The cover body is selectively connected to the first cover member and the second cover member. When the cover body is connected to the first cover member, the air-guiding cover is in the first guiding state, and the air-guiding cover separates the air flow into a first flow and a second flow. When the cover body is connected to the second cover member, the air-guiding cover is in the second guiding state, and the air-guiding cover gathers the air flow into a third flow.

In the electronic computing device of the embodiment of the invention, the cover body is selectively connected to the first cover member and the second cover member. Therefore, the air-guiding cover is adapted to be switched between the first guiding state and the second guiding state. Utilizing the electronic computing device of the embodiment of the invention, the first cover member and the second cover member can be selected to modify the flow path according to the graphics card or the plug-and-play expansion card mounted inside the electronic computing device. The heat dissipation effect inside the electronic computing device is improved. The cost of the mold for manufacturing the air-guiding cover is reduced, and the manufacturing speed is increased.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
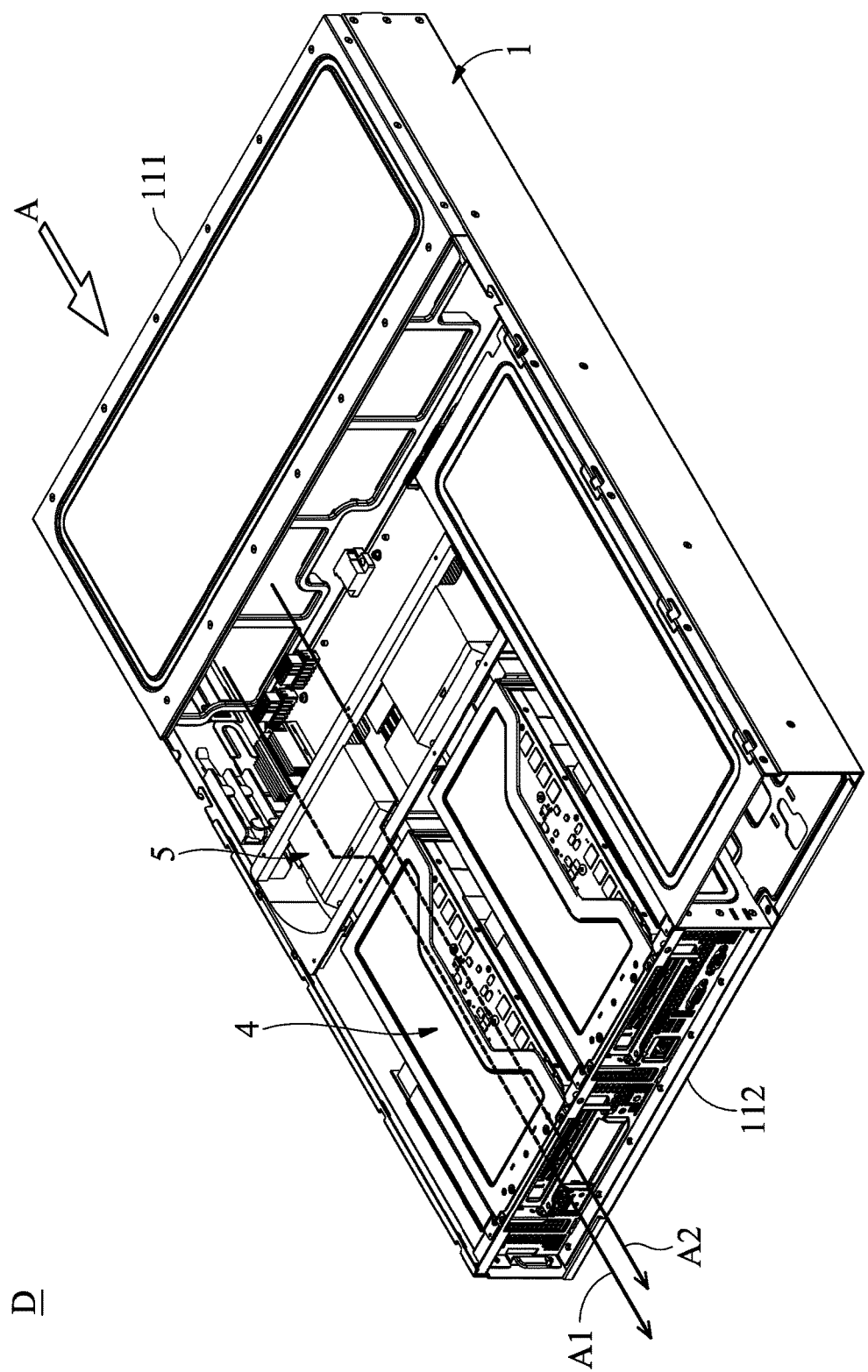
FIG. 1A shows an electronic computing device of the embodiment of the invention, wherein the electronic computing device is in a first guiding state.
Figure 1B:
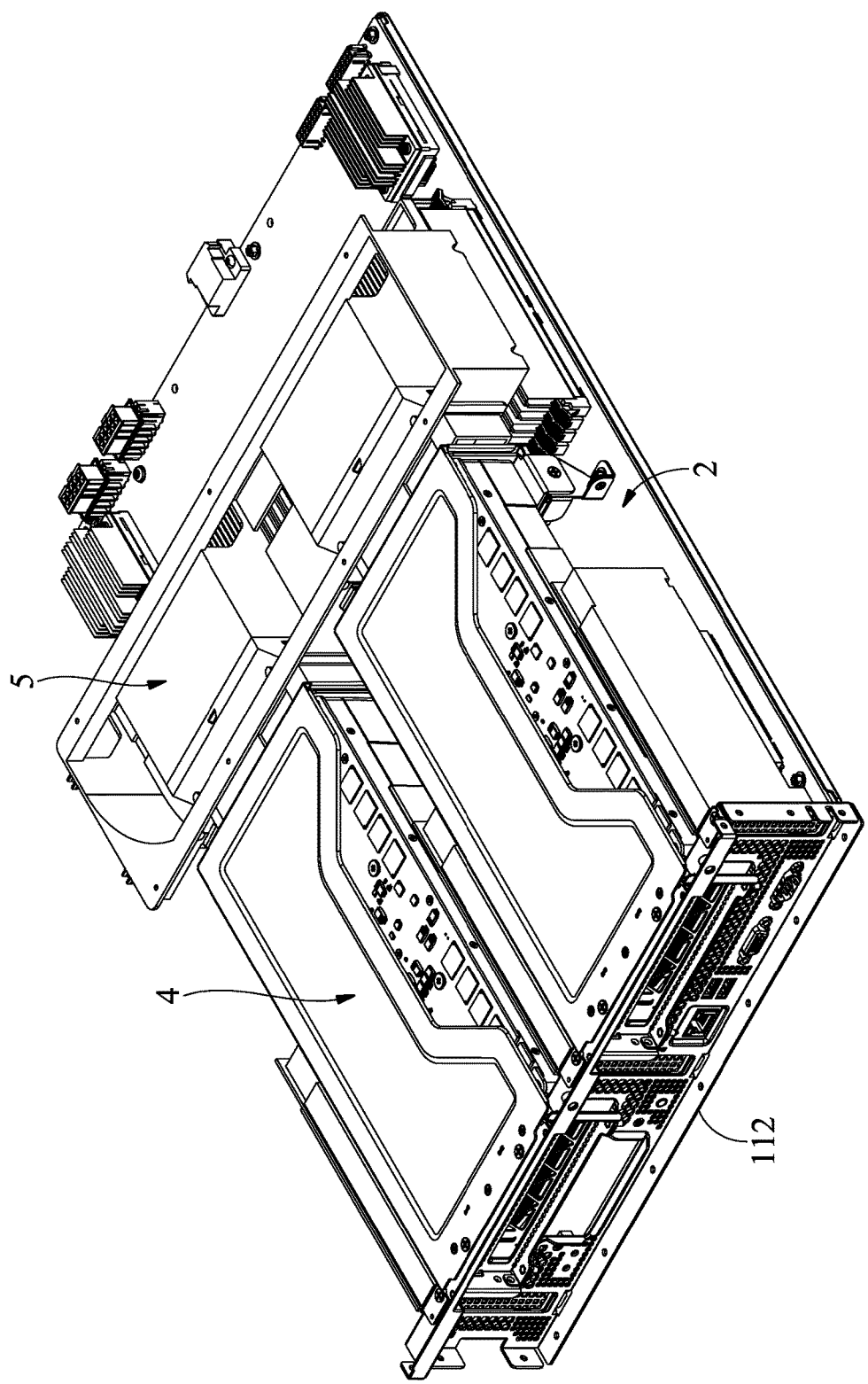
FIG. 1B shows the details of the electronic computing device of the embodiment of the invention, wherein the electronic computing device is in the first guiding state.
Figure 2A:
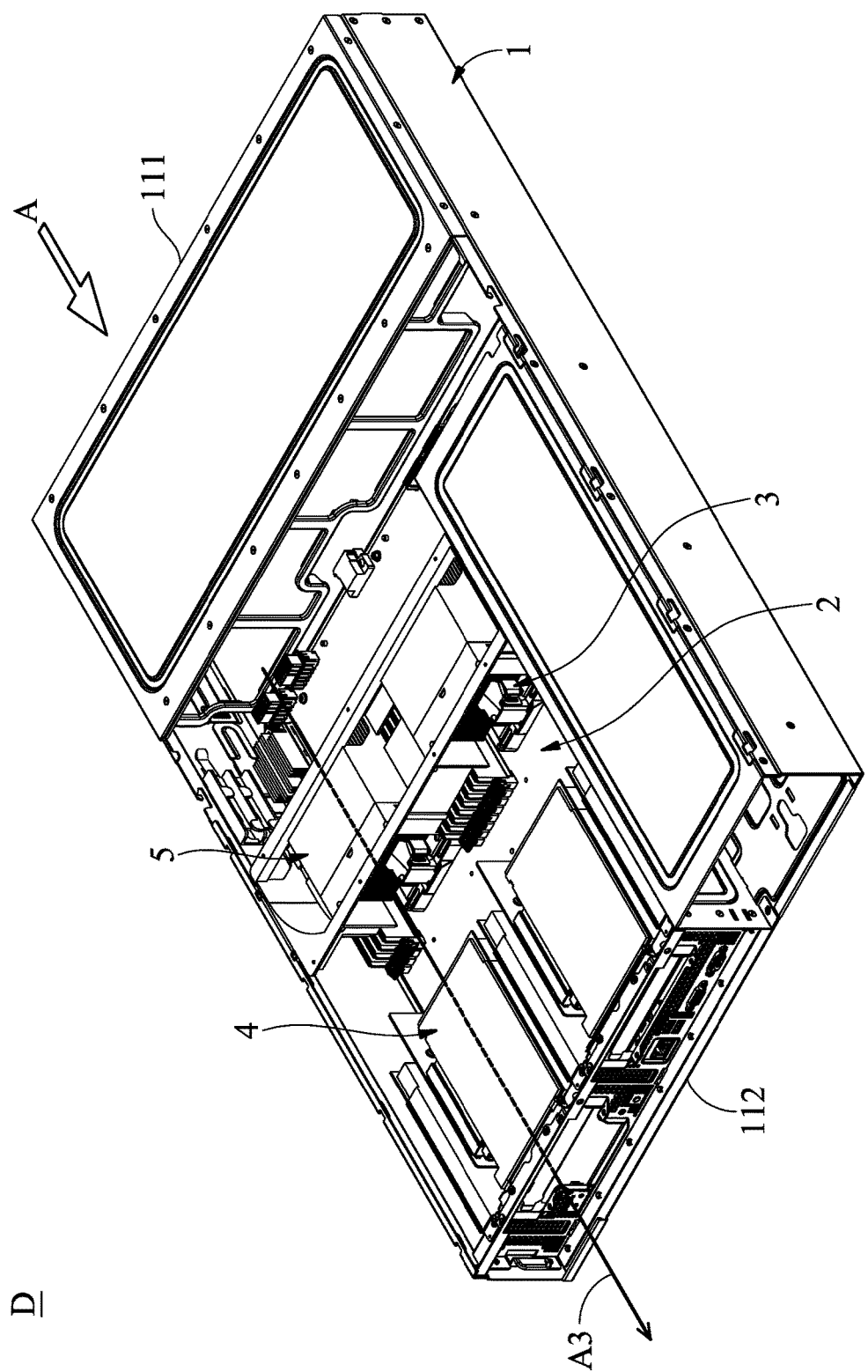
FIG. 2A shows the electronic computing device of the embodiment of the invention, wherein the electronic computing device is in a second guiding state.
Figure 2B:
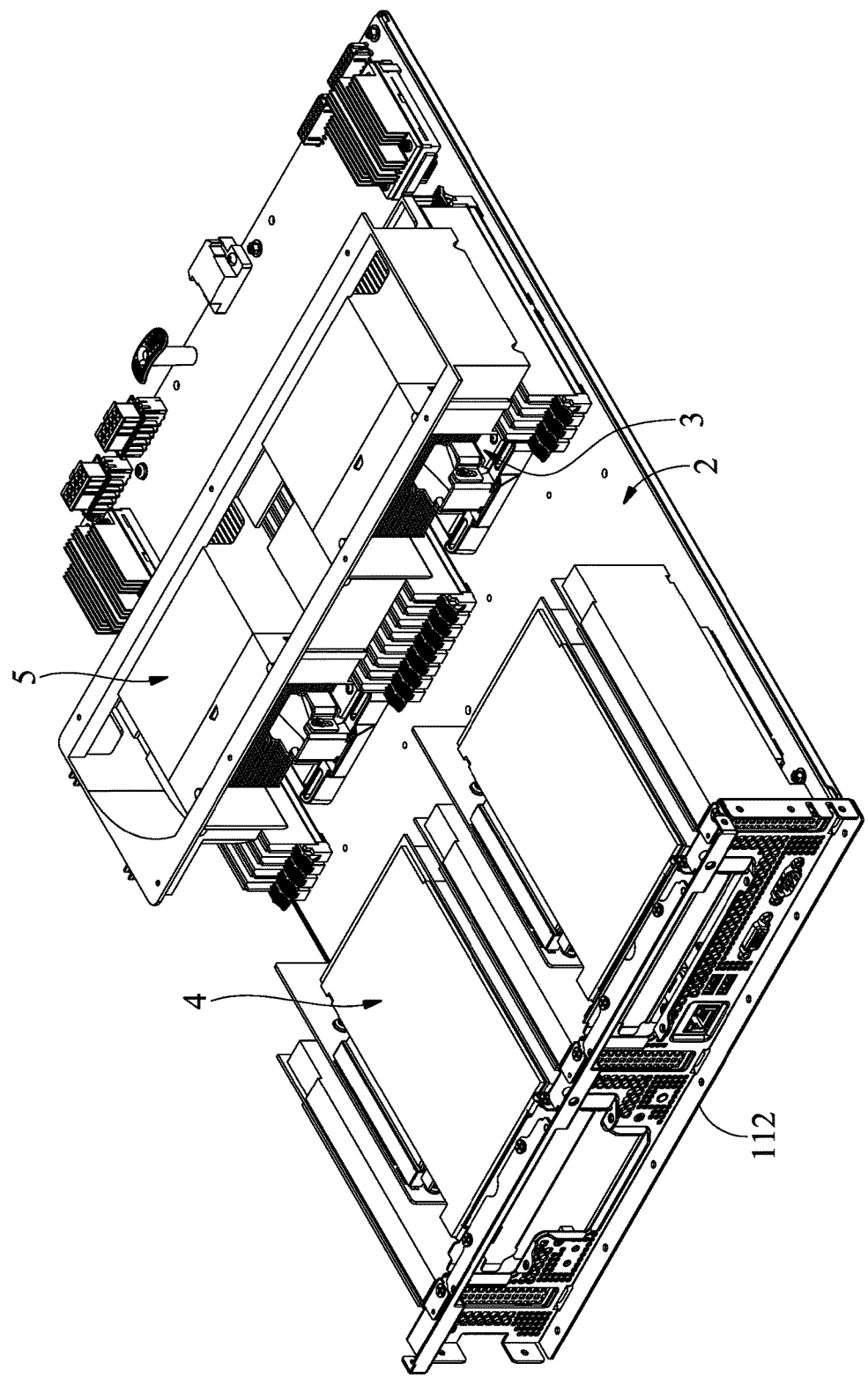
FIG. 2B shows the details of the electronic computing device of the embodiment of the invention, wherein the electronic computing device is in the second guiding state.

FIG. 1A shows an electronic computing device of the embodiment of the invention, wherein the electronic computing device is in a first guiding state. FIG. 1B shows the details of the electronic computing device of the embodiment of the invention, wherein the electronic computing device is in the first guiding state. FIG. 2A shows the electronic computing device of the embodiment of the invention, wherein the electronic computing device is in a second guiding state. FIG. 2B shows the details of the electronic computing device of the embodiment of the invention, wherein the electronic computing device is in the second guiding state. With reference to FIGS. 1A, 1B, 2A and 2B, the electronic computing device D of the embodiment of the invention includes a housing 1, a mainboard 2, a central processing unit 3 (not shown in FIGS. 1A and 1B), an expansion unit 4 and an air-guiding cover 5. The housing 1 comprises a device inlet side 111 and a device outlet side 112. The mainboard 2 is disposed in the housing 1. The central processing unit 3 is disposed on the mainboard 1. In one embodiment, a heat sink (with heat dissipation fins for example) can be disposed on the central processing unit 3. The expansion unit 4 is coupled to the mainboard 2. The air-guiding cover 5 is covering the central processing unit 3 and above the central processing unit 3, wherein the air-guiding cover 5 is located between the expansion unit 4 and the device inlet side 111, and the air-guiding cover 5 is adapted to be switched between the first guiding state (FIGS. 1A and 1B) and the second guiding state (FIGS. 2A and 2B).

Figure 3A:
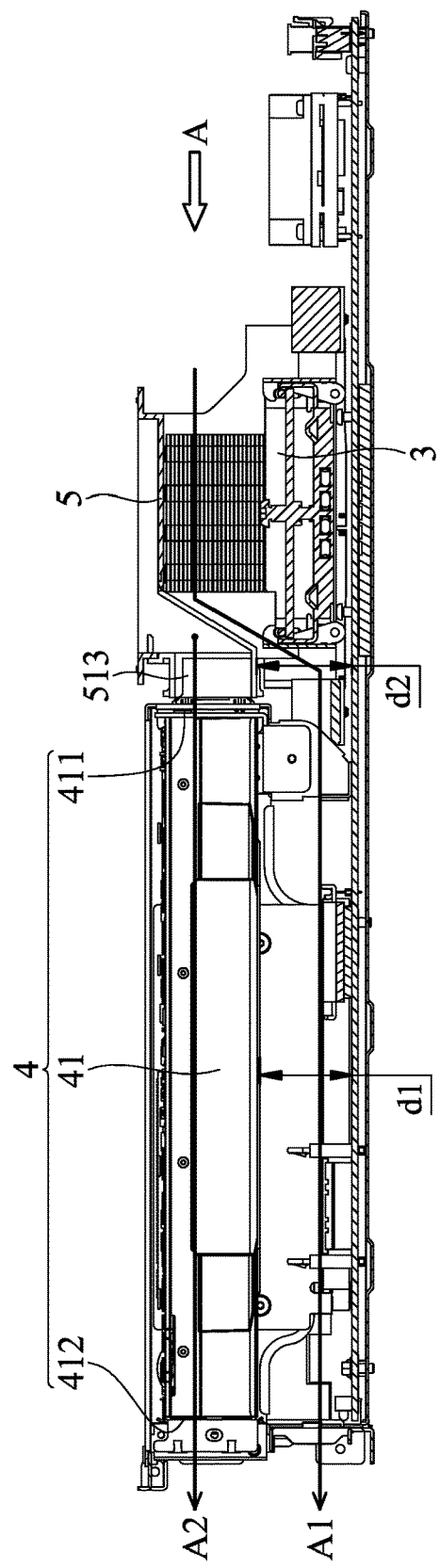
FIG. 3A is a sectional view of a portion of the electronic computing device of the embodiment of the invention, wherein the electronic computing device is in the first guiding state.

FIG. 3A is a sectional view of a portion of the electronic computing device of the embodiment of the invention, wherein the electronic computing device is in the first guiding state. With reference to FIGS. 1A, 1B and 3A, when the air-guiding cover is in the first guiding state, the air-guiding cover 5 separates an air flow A from the device inlet side 111 into a first flow A1 and a second flow A2, the first flow A1 passes the central processing unit 3 to remove central processing unit heat generated by the central processing unit 3, and then passes through a first gap d1 between the expansion unit 4 and the mainboard 2, and travels to the device outlet side 112. The second air flow A2 is guided by the air-guiding cover 5, and then directly passes the expansion unit 4 to remove expansion unit heat generated by the expansion unit 4.

Figure 3B:
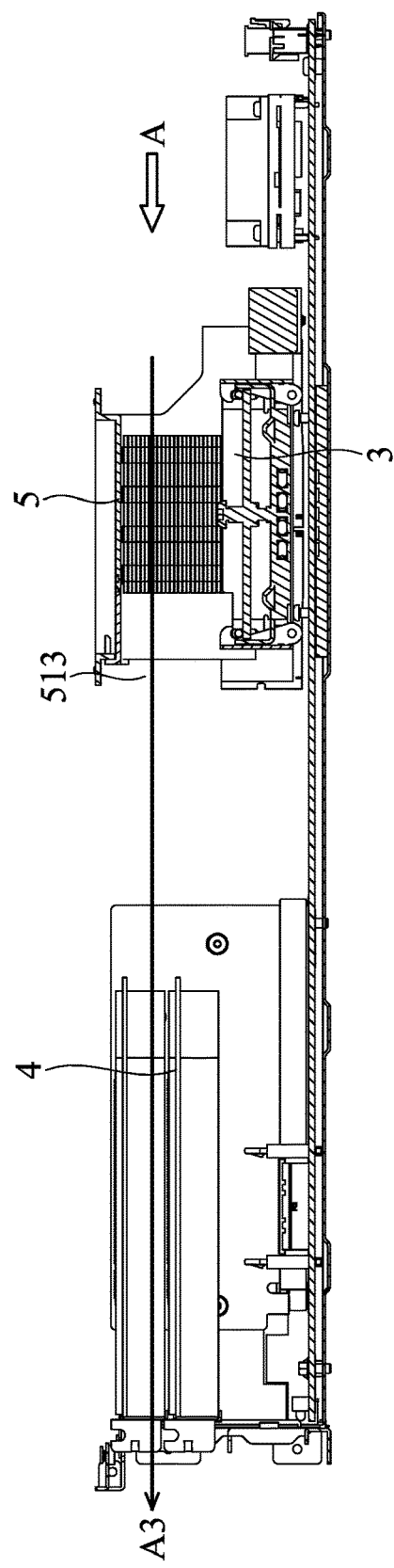
FIG. 3B is a sectional view of a portion of the electronic computing device of the embodiment of the invention, wherein the electronic computing device is in the second guiding state.

FIG. 3B is a sectional view of a portion of the electronic computing device of the embodiment of the invention, wherein the electronic computing device is in the second guiding state. With reference to FIGS. 2A, 2B and 3B, when the air-guiding cover 5 is in the second guiding state, the air-guiding cover 5 gathers the air flow A from the device inlet side 111 into a third flow A3, the third flow A3 passes the central processing unit 3 to remove central processing unit heat generated by the central processing unit 3, and then passes the expansion unit 4 to the device outlet side 112.

Figure 3C:
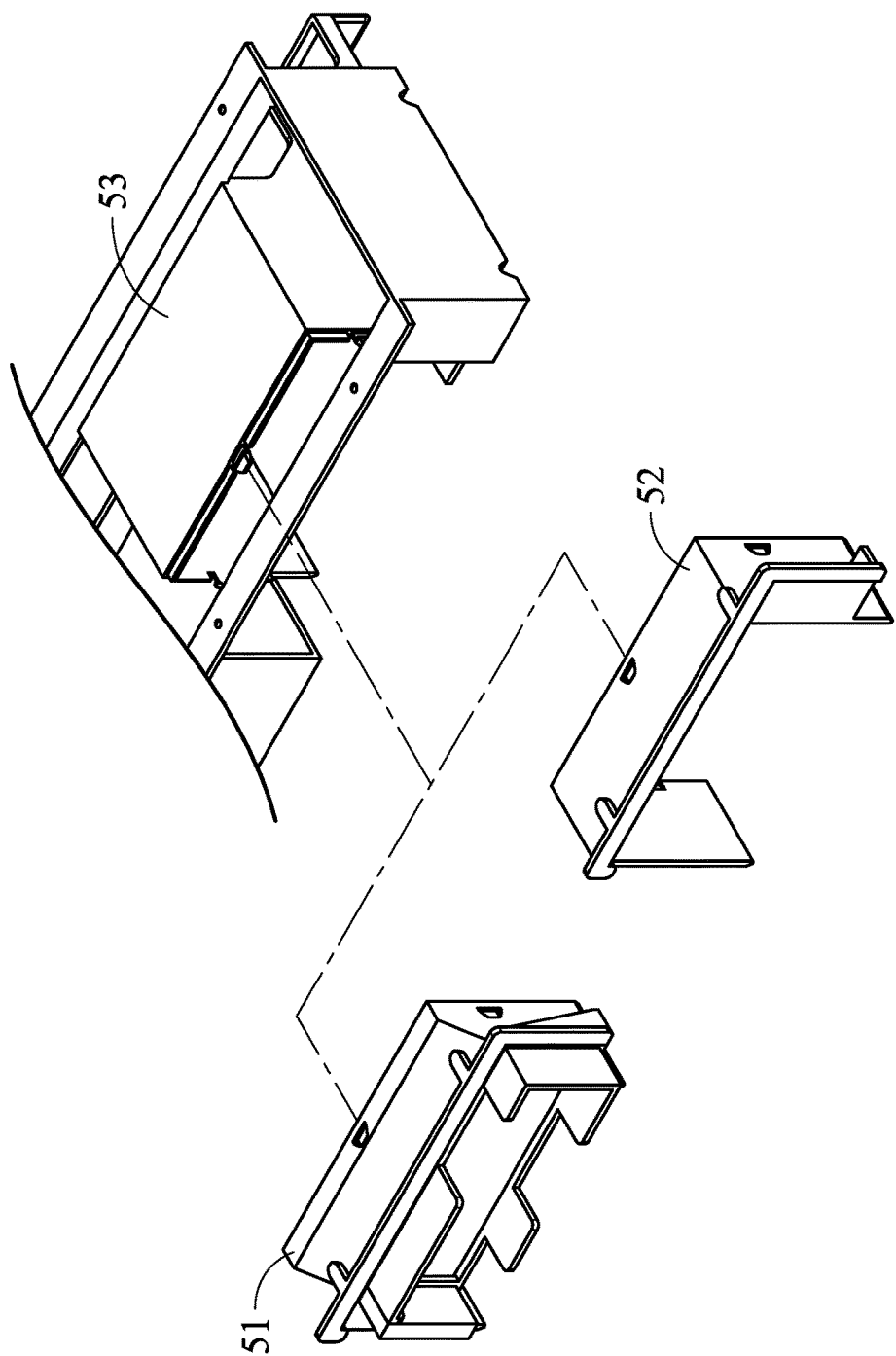
FIG. 3C shows the air-guiding cover of the embodiment of the invention selectively connected to the first cover member and the second cover member.
Figure 4A:
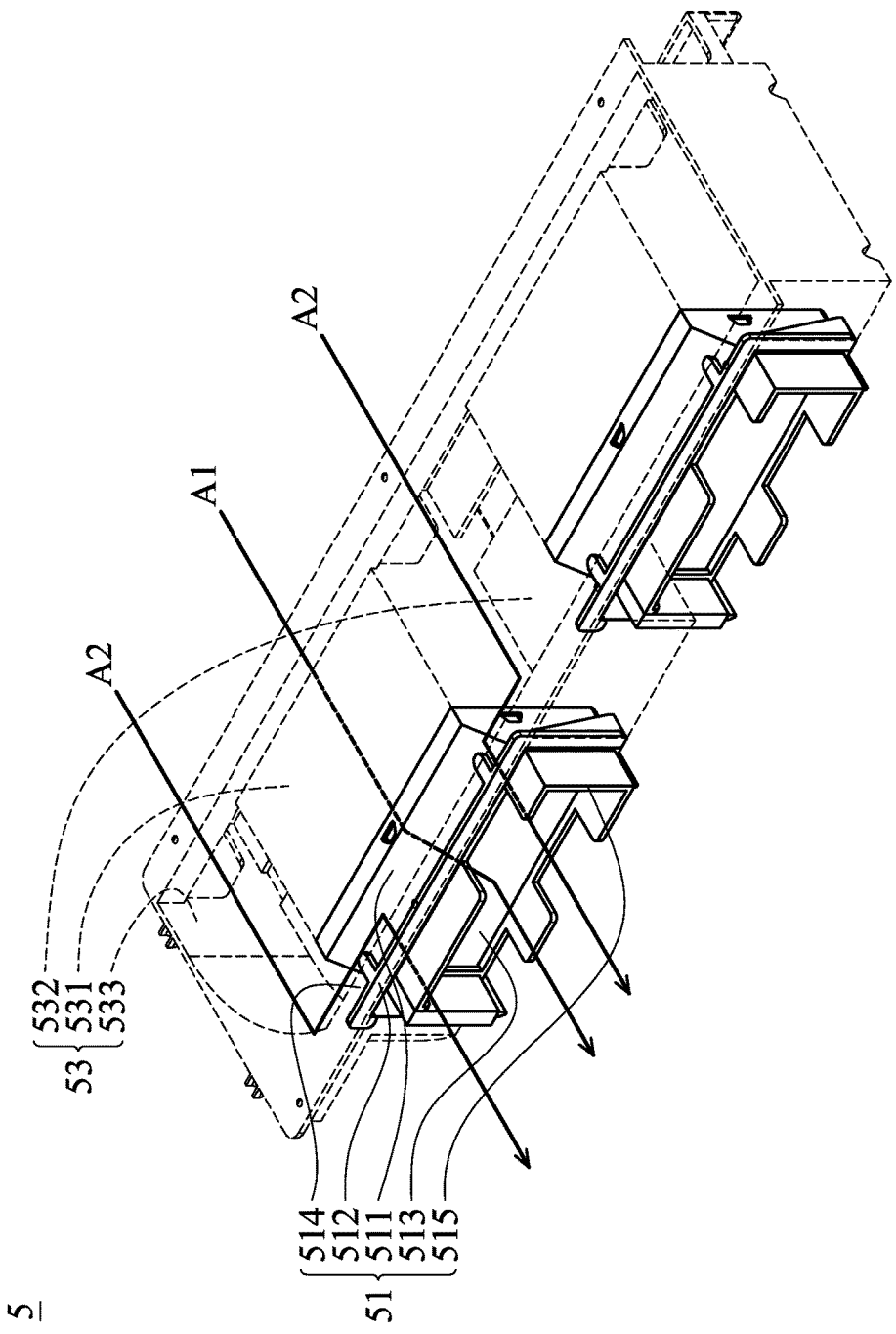
FIG. 4A shows the details of the air-guiding cover of the embodiment of the invention, wherein the air-guiding cover is in the first guiding state.
Figure 5A:
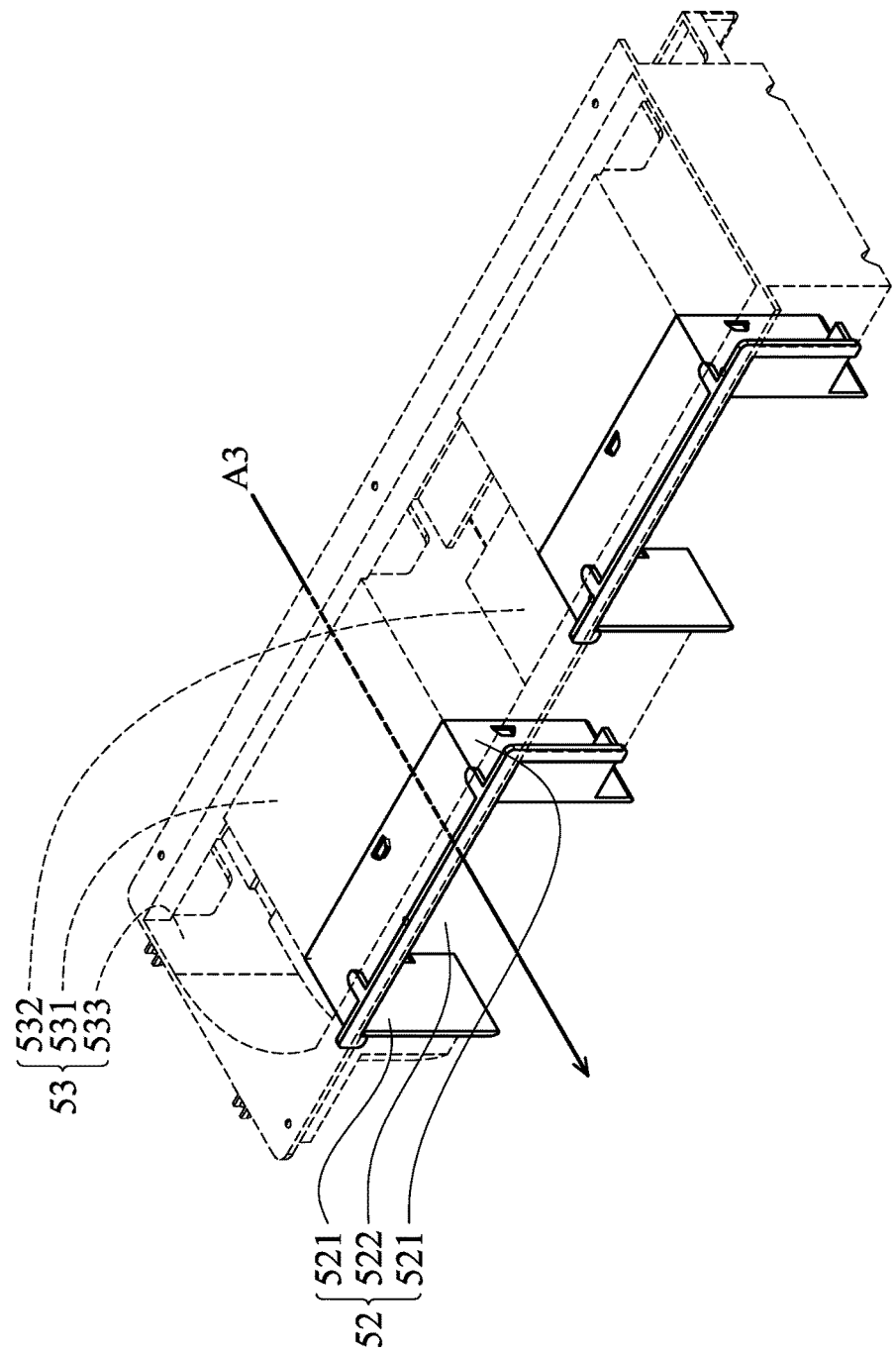
FIG. 5A shows the details of the air-guiding cover of the embodiment of the invention, wherein the air-guiding cover is in the second guiding state.

FIG. 4A shows the details of the air-guiding cover of the embodiment of the invention, wherein the air-guiding cover is in the first guiding state. FIG. 5A shows the details of the air-guiding cover of the embodiment of the invention, wherein the air-guiding cover is in the second guiding state. With reference to FIG. 3C, in one embodiment, the air-guiding cover 5 comprises a cover body 53. The air-guiding cover 5 selectively comprises a first cover member 51 and a second cover member 52. With reference to FIGS. 4A and 5A, when the cover body 53 is connected to the first cover member 51, the air-guiding cover 5 is in the first guiding state (FIG. 4A). When the cover body 53 is connected to the second cover member 52, the air-guiding cover 5 is in the second guiding state (FIG. 5A).

Figure 4B:
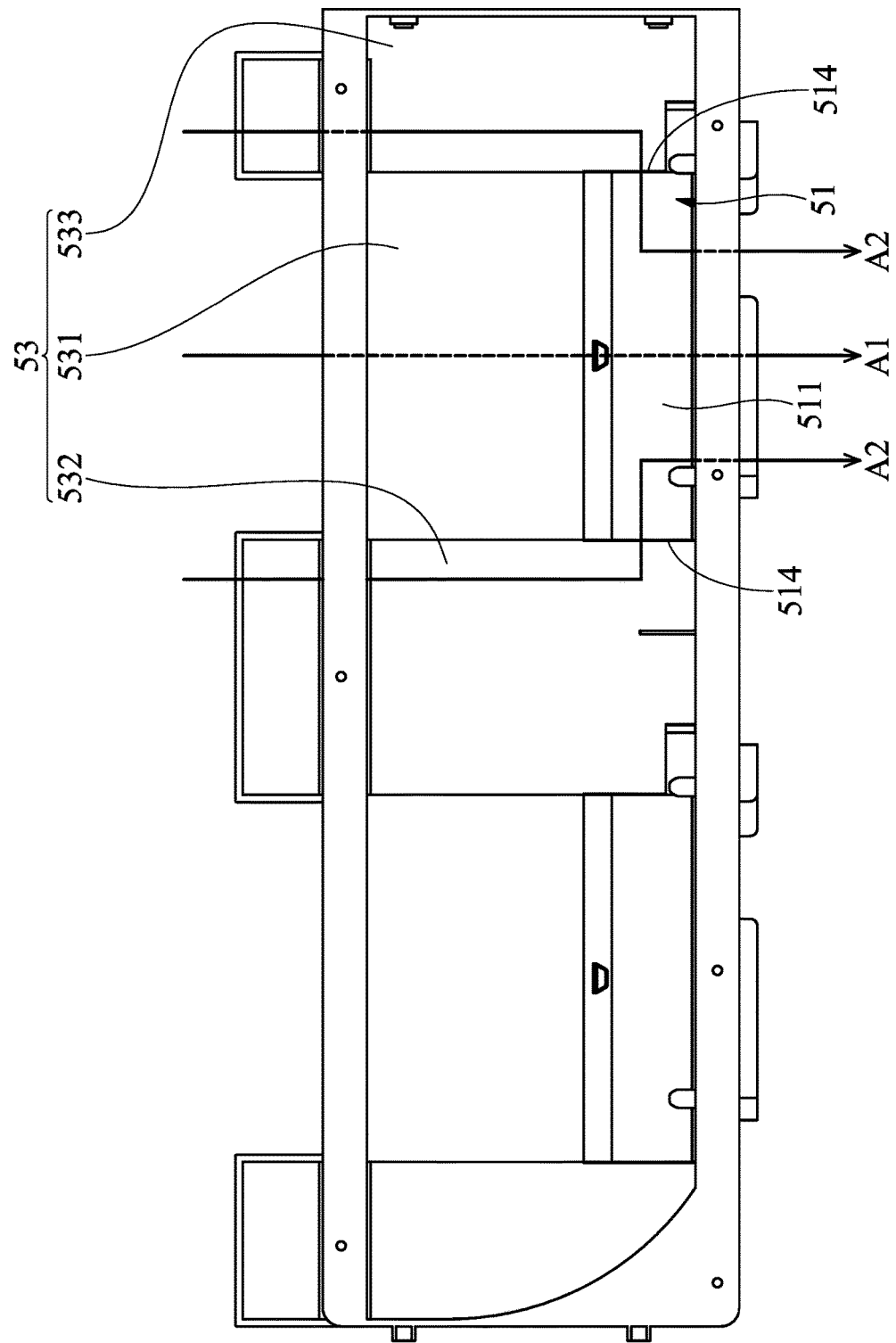
FIG. 4B is a top view of the air-guiding cover of the embodiment of the invention, wherein the air-guiding cover is in the first guiding state.

With reference to FIG. 4A, in one embodiment, the cover body 53 comprises a first path structure 531 and a second path structure 532. The first cover member 51 comprises a first shielding wall 511 and a guiding frame 512. The guiding frame 512 defines a first cover opening 513. The first shielding wall 511 connects to the guiding frame 512. An entrance notch 514 is formed between the first shielding wall 511 and the guiding frame 512. The first shielding wall 511 corresponds to the first path structure 531. The entrance notch 514 corresponds to the second path structure 532. The central processing unit is in the first path structure 531. FIG. 4B is a top view of the air-guiding cover of the embodiment of the invention, wherein the air-guiding cover is in the first guiding state. With reference to FIGS. 3A, 4A and 4B, when the cover body 53 connects to the first cover member 51, the first flow A1 passes through the first path structure 531 and is guided by the first shielding wall 511, and passes through a second gap d2 (as shown in FIG. 3A) between the guiding frame 512 and the mainboard to leave the guiding cover 5. The second flow A2 passes through the second path structure 532, enters the entrance notch 514, and passes through the first cover opening 513.

With reference to FIG. 4A, in one embodiment, the guiding frame 51 comprises a surrounding wall 515, and the surrounding wall 515 surrounds the first cover opening 513 to improve the guiding effect of the guiding frame 51.

With reference to FIGS. 1A, 1B and 3A, in one embodiment, when the guide cover 5 is in the first guiding state, the expansion unit 4 comprises a graphics card 41, a unit inlet 411 and a unit outlet 412. The first cover opening 513 corresponds to the unit inlet 411, the second air flow A2 travels from the first cover opening 513, enters the unit inlet 411, removes graphics card heat generated by the graphics card 41, and leaves the expansion unit 4 through the unit outlet 412. In the first guiding state, the expansion unit 4 comprises the graphics card 41, and the temperature of the expansion unit 4 is high. Therefore, the second air flow A2 is required merely for removing graphics card heat generated by the graphics card 41 to prevent central processing unit heat from accumulating in the graphics card 41.

With reference to FIGS. 4A and 4B, in one embodiment, the cover body 53 further comprises a third path structure 533. The first path structure 531 is sandwiched between the second path structure 532 and the third path structure 533. When the cover body 53 connects to the first cover member 51, the second flow A2 passes through the second path structure 532 and the third path structure 533 simultaneously, and enters the entrance notch 514, and passes through the first cover opening 513. In one embodiment, as shown in FIG. 4B, on a projection plane, the first flow A1 passes the guide cover 5 in a straight path, and the second flow A2 passes the guide cover 5 in a Y-shaped path.

Figure 5B:
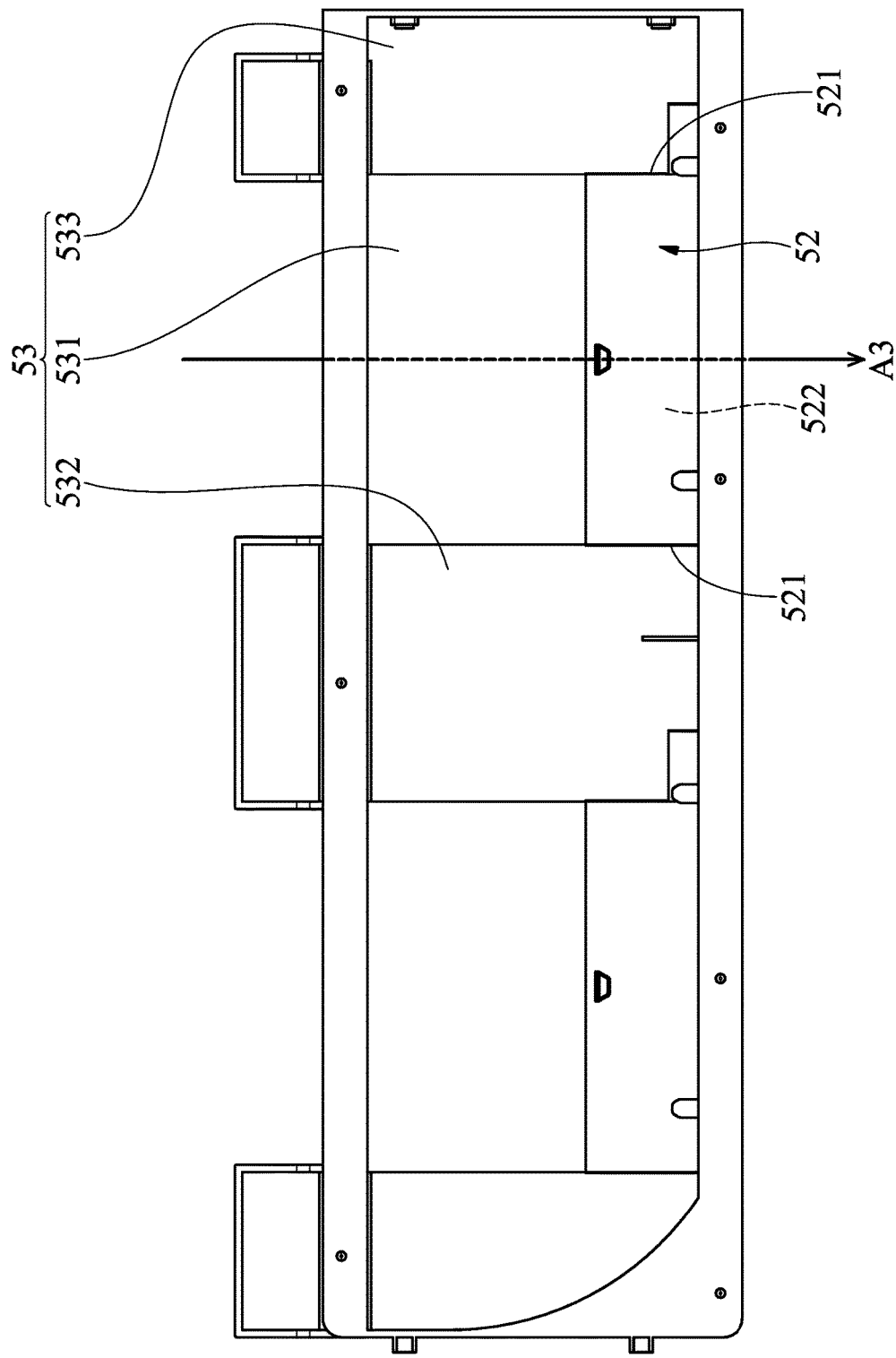
FIG. 5B is a top view of the air-guiding cover of the embodiment of the invention, wherein the air-guiding cover is in the second guiding state.

FIG. 5B is a top view of the air-guiding cover of the embodiment of the invention, wherein the air-guiding cover is in the second guiding state. With reference to FIGS. 3B, 5A and 5B, in one embodiment, the second cover member 52 comprises a second shielding wall 521 and a second cover opening 522. The second shielding wall 521 blocks the second path structure 532 and the third path structure 533, and the second cover opening 522 is communicated to the first path structure 531. When the cover body 53 connects to the second cover member 52, the third flow A3 passes through the first path structure 531 and the second cover opening 522, and passes the expansion unit 4.

With reference to FIGS. 2A, 2B and 3B, in one embodiment, when the guide cover 5 is in the second guiding state, the expansion unit 4 comprises at least one plug-and-play expansion card. In the second guiding state, the expansion unit 4 comprises the plug-and-play expansion card. The temperature of the plug-and-play expansion card is lower than the graphics card. The third flow A3 passing the central processing unit 3 can pass the expansion unit 4, and then travels to the device outlet side 112.

In the embodiments of the invention, the graphics card is the expansion card with higher working temperature, and the working temperature of the graphics card is between 75~85° C. The plug-and-play expansion card is the expansion card with lower working temperature (the expansion card other than the graphics card), and the working temperature of the plug-and-play expansion card is between 60~70° C.

With reference to FIGS. 5A and 5B, in one embodiment, on the projection plane, when the guide cover 5 is in the second guiding state, the third flow A3 passes the guide cover 5 in the straight path.

In the electronic computing device of the embodiment of the invention, the cover body is selectively connected to the first cover member and the second cover member. Therefore, the air-guiding cover is adapted to be switched between the first guiding state and the second guiding state. Utilizing the electronic computing device of the embodiment of the invention, the first cover member and the second cover member can be selected to modify the flow path according to the graphics card or the plug-and-play expansion card mounted inside the electronic computing device. The heat dissipation effect inside the electronic computing device is improved. The cost of the mold for manufacturing the air-guiding cover is reduced, and the manufacturing speed is increased.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic computing device, comprising:
   a housing, comprising a device inlet side and a device outlet side;
   a mainboard, disposed in the housing;
   a central processing unit, disposed on the mainboard;
   an expansion unit, coupled to the mainboard; and
   an air-guiding cover, covering above the central processing unit, wherein the air-guiding cover is located between the expansion unit and the device inlet side, and the air-guiding cover is adapted to be switched between a first guiding state and a second guiding state,
   wherein when the air-guiding cover is in the first guiding state, the air-guiding cover separates an air flow from the device inlet side into a first flow and a second flow, the first flow passes the central processing unit to remove central processing unit heat generated by the central processing unit, and then passes through a first gap between the expansion unit and the mainboard, and travels to the device outlet side, and the second air flow is guided by the air-guiding cover, and then directly passes the expansion unit to remove expansion unit heat generated by the expansion unit,
   wherein when the air-guiding cover is in the second guiding state, the air-guiding cover gathers the air flow from the device inlet side into a third flow, the third flow passes the central processing unit to remove central processing unit heat generated by the central processing unit, and then passes the expansion unit to the device outlet side.

2. The electronic computing device as claimed in claim 1, wherein the air-guiding cover comprises a cover body, the air-guiding cover selectively comprises a first cover member and a second cover member, when the cover body is connected to the first cover member, the air-guiding cover is in the first guiding state, and when the cover body is connected to the second cover member, the air-guiding cover is in the second guiding state.

3. The electronic computing device as claimed in claim 2, wherein the cover body comprises a first path structure and a second path structure, the first cover member comprises a first shielding wall and a guiding frame, the guiding frame defines a first cover opening, the first shielding wall connects to the guiding frame, an entrance notch is formed between the first shielding wall and the guiding frame, the first shielding wall corresponds to the first path structure, the entrance notch corresponds to the second path structure, and the central processing unit is in the first path structure.

4. The electronic computing device as claimed in claim 3, wherein when the cover body connects to the first cover member, the first flow passes through the first path structure and is guided by the first shielding wall, and passes through a second gap between the guiding frame and the mainboard to leave the guiding cover, and the second flow passes through the second path structure, enters the entrance notch, and passes through the first cover opening.

5. The electronic computing device as claimed in claim 4, wherein the guiding frame comprises a surrounding wall, and the surrounding wall surrounds the first cover opening.

6. The electronic computing device as claimed in claim 4, wherein when the guide cover is in the first guiding state, the expansion unit comprises a graphics card, a unit inlet and a unit outlet, the first cover opening corresponds to the unit inlet, the second air flow travels from the first cover opening, enters the unit inlet, removes graphics card heat generated by the graphics card, and leaves the expansion unit through the unit outlet.

7. The electronic computing device as claimed in claim 4, wherein the cover body further comprises a third path structure, the first path structure is sandwiched between the second path structure and the third path structure, and when the cover body connects to the first cover member, the second flow passes through the second path structure and the third path structure simultaneously, and enters the entrance notch, and passes through the first cover opening.

8. The electronic computing device as claimed in claim 3, wherein the second cover member comprises a second shielding wall and a second cover opening, the second shielding wall blocks the second path structure, and the second cover opening is communicated to the first path structure.

9. The electronic computing device as claimed in claim 8, wherein when the cover body connects to the second cover member, the third flow passes through the first path structure and the second cover opening, and passes the expansion unit.

10. The electronic computing device as claimed in claim 9, wherein when the guide cover is in the second guiding state, the expansion unit comprises at least one plug-and-play expansion card.

11. The electronic computing device as claimed in claim 8, wherein the cover body further comprises a third path structure, the first path structure is sandwiched between the second path structure and the third path structure, and when the cover body connects to the second cover member, the second shielding wall blocks the second path structure and the third path structure.

12. The electronic computing device as claimed in claim 1, wherein on a projection plane, when the guide cover is in the first guiding state, the first flow passes the guide cover in a straight path, and the second flow passes the guide cover in a Y-shaped path, and when the guide cover is in the second guiding state, the third flow passes the guide cover in the straight path.

13. An air-guiding cover, comprising:
   a cover body;
   a first cover member; and
   a second cover member, wherein the cover body is selectively connectable to one of the first cover member and the second cover member at a time, and wherein when the cover body is connected to the first cover member, the air-guiding cover is in a first guiding state, and the air-guiding cover separates an air flow into a first flow and a second flow, and when the cover body is connected to the second cover member, the air-guiding cover is in a second guiding state, and the air-guiding cover gathers the air flow into a third flow,
   wherein the cover body comprises a first path structure and a second path structure, the first cover member comprises a first shielding wall and a guiding frame, the guiding frame defines a first cover opening, the first shielding wall connects to the guiding frame, an entrance notch is formed between the first shielding wall and the guiding frame, the first shielding wall corresponds to the first path structure, the entrance notch corresponds to the second path structure, and a central processing unit is in the first path structure.

14. The air-guiding cover as claimed in claim 13, wherein when the cover body connects to the first cover member, the first flow passes through the first path structure and is guided by the first shielding wall, and passes through a second gap between the guiding frame and the mainboard to leave the guiding cover, and the second flow passes through the second path structure, enters the entrance notch, and passes through the first cover opening.

15. The air-guiding cover as claimed in claim 14, wherein the guiding frame comprises a surrounding wall, and the surrounding wall surrounds the first cover opening.

16. The air-guiding cover as claimed in claim 14, wherein the cover body further comprises a third path structure, the first path structure is sandwiched between the second path structure and the third path structure, and when the cover body connects to the first cover member, the second flow passes through the second path structure and the third path structure simultaneously, and enters the entrance notch, and passes through the first cover opening.

17. The air-guiding cover as claimed in claim 13, wherein the second cover member comprises a second shielding wall and a second cover opening, the second shielding wall blocks the second path structure, and the second cover opening is communicated to the first path structure.

18. The air-guiding cover as claimed in claim 17, wherein when the cover body connects to the second cover member, the third flow passes through the first path structure and the second cover opening, and passes an expansion unit.

19. The air-guiding cover as claimed in claim 17, wherein the cover body further comprises a third path structure, the first path structure is sandwiched between the second path structure and the third path structure, and when the cover body connects to the second cover member, the second shielding wall blocks the second path structure and the third path structure.

20. An air-guiding cover, comprising:
    a cover body;
    a first cover member; and
    a second cover member, wherein the cover body is selectively connectable to one of the first cover member and the second cover member at a time, and wherein when the cover body is connected to the first cover member, the air-guiding cover is in a first guiding state, and the air-guiding cover separates an air flow into a first flow and a second flow, and when the cover body is connected to the second cover member, the air-guiding cover is in a second guiding state, and the air-guiding cover gathers the air flow into a third flow,
    wherein on a projection plane, when the guide cover is in the first guiding state, the first flow passes the guide cover in a straight path, and the second flow passes the guide cover in a Y-shaped path, and when the guide cover is in the second guiding state, the third flow passes the guide cover in the straight path.

21. The air-guiding cover as claimed in claim 13, wherein the first flow and the second flow are adapted to remove heat from different heat sources.

\* \* \* \* \*